United States Patent
Basceri et al.

(10) Patent No.: US 9,246,051 B2
(45) Date of Patent: Jan. 26, 2016

(54) SOLID STATE LIGHTING DEVICES WITH REDUCED CRYSTAL LATTICE DISLOCATIONS AND ASSOCIATED METHODS OF MANUFACTURING

(71) Applicant: Micron Technology, Inc., Boise, ID (US)

(72) Inventors: Cem Basceri, Los Gatos, CA (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/276,163

(22) Filed: May 13, 2014

(65) Prior Publication Data
US 2014/0246683 A1    Sep. 4, 2014

Related U.S. Application Data

(60) Continuation of application No. 13/604,187, filed on Sep. 5, 2012, now Pat. No. 8,728,840, which is a division of application No. 12/838,220, filed on Jul. 16, 2010, now Pat. No. 8,263,988.

(51) Int. Cl.
*H01L 33/04* (2010.01)
*H01L 33/02* (2010.01)
*H01L 33/00* (2010.01)
*H01L 33/12* (2010.01)
(Continued)

(52) U.S. Cl.
CPC .......... *H01L 33/025* (2013.01); *H01L 21/0237* (2013.01); *H01L 21/0254* (2013.01); *H01L 21/0262* (2013.01); *H01L 21/02381* (2013.01); *H01L 21/02521* (2013.01); *H01L 21/02639* (2013.01); *H01L 21/02645* (2013.01); *H01L 21/02647* (2013.01); *H01L 33/007* (2013.01); *H01L 33/12* (2013.01); *H01L 21/0245* (2013.01); *H01L 21/02502* (2013.01); *H01L 21/02609* (2013.01); *H01L 33/32* (2013.01)

(58) Field of Classification Search
CPC ................ H01L 33/22; H01L 21/0245; H01L 21/02502; H01L 21/02609
USPC ........................................... 257/94, 103, 627
See application file for complete search history.

(56) References Cited

U.S. PATENT DOCUMENTS

| | | | |
|---|---|---|---|
| 5,650,351 A | * | 7/1997 | Wu ................................ 438/398 |
| 5,702,968 A | * | 12/1997 | Chen ............................. 438/253 |
| 5,989,969 A | | 11/1999 | Watanabe et al. |

(Continued)

OTHER PUBLICATIONS

Lee, J-H. et al., Stress Reduction and Enhanced Extraction Efficiency of GaN-Based LED Grown on Cone-Shape-Patterned Sapphire, IEEE Photonics Technology Letters, vol. 20, No. 18, pp. 1563-1565, Sep. 15, 2008.

(Continued)

*Primary Examiner* — George Fourson, III
(74) *Attorney, Agent, or Firm* — Perkins Coie LLP

(57) ABSTRACT

Solid state lighting devices and associated methods of manufacturing are disclosed herein. In one embodiment, a solid state lighting device includes a substrate material having a substrate surface and a plurality of hemispherical grained silicon ("HSG") structures on the substrate surface of the substrate material. The solid state lighting device also includes a semiconductor material on the substrate material, at least a portion of which is between the plurality of HSG structures.

20 Claims, 4 Drawing Sheets

(51) Int. Cl.
*H01L 33/32* (2010.01)
*H01L 21/02* (2006.01)

(56) References Cited

U.S. PATENT DOCUMENTS

| | | | |
|---|---|---|---|
| 6,043,132 | A | 3/2000 | Jung |
| 6,060,355 | A * | 5/2000 | Batra et al. ............... 438/255 |
| 6,066,872 | A | 5/2000 | Okada et al. |
| 6,281,142 | B1 | 8/2001 | Basceri et al. |
| 6,281,427 | B1 | 8/2001 | Mitsuhiro et al. |
| 6,775,314 | B1 | 8/2004 | Waldrip et al. |
| 6,881,652 | B2 | 4/2005 | Ping |
| 6,902,973 | B2 | 6/2005 | Chen et al. |
| 7,361,578 | B2 | 4/2008 | Gu |
| 8,263,988 | B2 | 9/2012 | Basceri et al. |
| 2005/0176213 | A1 * | 8/2005 | Chen et al. ............... 438/398 |
| 2005/0250302 | A1 | 11/2005 | Todd et al. |
| 2008/0087881 | A1 | 4/2008 | Ueda et al. |
| 2009/0236629 | A1 * | 9/2009 | Nishikawa et al. ........... 257/103 |
| 2011/0150017 | A1 * | 6/2011 | Chua et al. ............... 372/45.01 |
| 2011/0278582 | A1 * | 11/2011 | Tezuka et al. ............... 257/66 |
| 2012/0012812 | A1 | 1/2012 | Basceri et al. |
| 2012/0187408 | A1 * | 7/2012 | Tanaka et al. ............... 257/64 |
| 2012/0329191 | A1 | 12/2012 | Basceri et al. |

OTHER PUBLICATIONS

Cheng, J-H. et al., Improved Crystal Quality and Performance of GaN-Based Light-Emitting Diodes by Decreasing the Slanted Angle of Patterned Sapphire, Applied Physics Letters 96, 051109 (2010).

Popova, D.A., Analyses of Threading Dislocation Density in GaN/Al2O3 in Heterostructures Grown Under Different Growth Conditions, The International Centre of Advanced Materials Science and Electron Microscopy, Autumn School on Emerging Microscopy for Advanced Materials Development, Imaging and Spectroscopy on Atomic Scale, Oct. 2004, Humboldt University, Berlin, <http://crysta.physik.hu-berlin.de/as2004/pdf/abstracts/2p_abstract_popova.pdf>.

Feezell, D.F. et al., Development of Nonpolar and Semipolar InGaN/GaN Visible Light-Emitting Diodes, MRS Bulletin, vol. 34, pp. 318-323, May 2009.

* cited by examiner

SOLID STATE LIGHTING DEVICES WITH REDUCED CRYSTAL LATTICE DISLOCATIONS AND ASSOCIATED METHODS OF MANUFACTURING

CROSS-REFERENCE TO RELATED APPLICATIONS

This application is a continuation of U.S. application Ser. No. 13/604,187 filed Sep. 5, 2012, now U.S. Pat. No. 8,728,840, which is a divisional of U.S. application Ser. No. 12/838,220 filed Jul. 16, 2010, now U.S. Pat. No. 8,263,988, each of which is incorporated herein by reference in its entirety.

TECHNICAL FIELD

The present technology is directed generally to solid state lighting ("SSL") devices with reduced number of crystal lattice dislocations when compared to conventional devices. The present technology is also directed to associated methods of manufacturing such SSL devices.

BACKGROUND

SSL devices generally use semiconductor light emitting diodes ("LEDs"), organic light emitting diodes ("OLEDs"), laser diodes ("LDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED 10. As shown in FIG. 1, the LED 10 includes a substrate 12 (e.g., silicon carbide, sapphire, or silicon), an N-type gallium nitride ("GaN") material 14, an active region 16 (e.g., GaN/InGaN multi quantum wells ("MQWs")), and a P-type GaN material 18 on top of one another in series.

The GaN/InGaN materials of the LED 10 are generally formed via epitaxial growth and typically include a large number of crystal dislocations. For example, FIG. 2 is a transmission electron microscopy ("TEM") image 20 of a GaN material 24 formed on a sapphire substrate 22 via metal organic chemical vapor deposition ("MOCVD"). As shown in FIG. 2, the GaN material 24 includes a plurality of threading dislocations 26 extending away from the substrate 22 mainly due to lattice mismatch between the GaN material 24 and the substrate 22.

The large number of threading dislocations 26 may negatively impact the optical and/or electrical performance of the LEDs. For example, it is believed that the threading dislocations 26 can short circuit a P/N junction (e.g., in the active region 16 of the LED 10) and/or cause current leakage in the LEDs. It is also believed that impurities (e.g., carbon (C), oxygen (O), silicon (Si), and hydrogen (H)) tend to aggregate in the cores of the threading dislocations 26. Such impurities can cause non-radiated hole-electron recombination during operation, thus causing low optical efficiencies in the LEDs. Accordingly, several improvements to reduce the number of threading dislocations in LEDs may be desirable.

DETAILED DESCRIPTION

Various embodiments of SSL devices and associated methods of manufacturing are described below. The term "microelectronic substrate" is used throughout to include substrates upon which and/or in which SSL devices, microelectronic devices, micromechanical devices, data storage elements, read/write components, and other features are fabricated. The term "lattice dislocation" generally refers to a crystallographic defect or irregularity within a crystal structure. A lattice dislocation can include an edge dislocation, a threading (or screw) dislocation, and/or a combination thereof. A person skilled in the relevant art will also understand that the technology may have additional embodiments, and that the technology may be practiced without several of the details of the embodiments described below with reference to FIGS. 3A-4C.

FIGS. 3A-3F are cross-sectional views of a portion of a microelectronic substrate 100 undergoing a process for forming an SSL device in accordance with embodiments of the technology. Even though only certain processing stages are illustrated in FIGS. 3A-3F, the process for forming the SSL device can also include other stages for forming a lens, a mirror material, a support structure, conductive interconnects, and/or other suitable mechanical/electrical components (not shown).

Figure 3A:
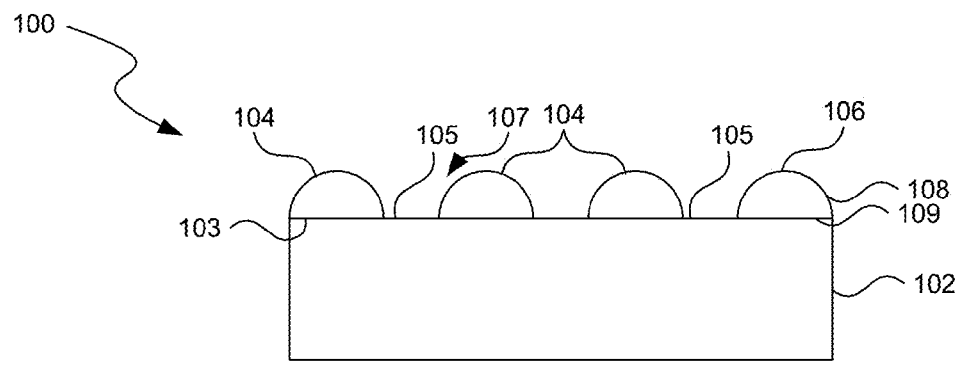
FIGS. 3A-3F are cross-sectional views of a portion of a microelectronic substrate undergoing a process for forming an SSL device in accordance with embodiments of the technology.

As shown in FIG. 3A, an initial operation of the process can include forming a plurality of hemispherical grained silicon ("HSG") structures 104 on a generally planar substrate surface 103 of a substrate material 102. In one embodiment, the substrate material 102 can include a silicon (Si) wafer, at least a portion of which has the Si(1,1,1) crystal orientation at the substrate surface 103. In other embodiments, the substrate material 102 can include silicon wafers with other crystal orientations (e.g., Si(1,0,0)). In further embodiments, the substrate material 102 can include AlGaN, GaN, silicon carbide (SiC), sapphire ($Al_2O_3$), a combination of the foregoing materials and/or other suitable substrate materials.

Various suitable techniques may be used to form the HSG structures 104. In one embodiment, the HSG structures 104 can be formed by contacting the substrate surface 103 with a source gas containing monosilane ($SiH_4$), disilane ($Si_2H_6$), and/or other suitable silanes ($Si_nH_{2n+2}$, where n is a positive integer) while the substrate material 102 is maintained at a seeding temperature (e.g., about 200° C.). The silanes can then decompose and seed the substrate surface 103 with amorphous silicon and/or polysilicon. The substrate material 102 can then be heated to a growth temperature (e.g., about 500° C. to about 600° C.) for a period of time (e.g., about 10 minutes) while contacting the source gas. Additional silanes can then decompose to form the HSG structures 104 on the substrate surface 103 via epitaxial growth and/or other suitable mechanisms.

In another embodiment, forming the HSG structures 104 can include initially depositing a desired amount of amorphous silicon and/or polysilicon on the substrate surface 103 of the substrate material 102. Subsequently, the substrate material 102 with the deposited amorphous silicon and/or polysilicon can be annealed such that the amorphous silicon and/or polysilicon are converted into the HSG silicon structures 104. In further embodiments, other suitable techniques may be used in addition to or in lieu of the foregoing techniques for forming the HSG structures 104.

As shown in FIG. 3A, the HSG structures 104 can individually include a base 109 in direct contact with the substrate surface 103, an apex 106 spaced apart from the base 109, and a hemispherical surface 108 between the apex 106 and the base 109. The HSG structures 104 can grow isotropically from the seeding stage to form the hemispherical surface 108. In the illustrated embodiment, the HSG structures 104 are arranged as an array with adjacent HSG structures 104 spaced apart from one another by gaps 107. A portion 105 of the substrate surface 103 is exposed by the gaps 107. In other embodiments, the HSG structures 104 may be arranged side by side, as described in more detail below with reference to FIGS. 4A-4C. In further embodiments, the HSG structures 104 may have random and/or other suitable arrangements.

In any of the foregoing embodiments, the spacing or pitch of the HSG structures 104 may be adjusted to achieve a desired dislocation density in materials that are subsequently formed on the substrate surface 103 based on empirical data and/or other suitable mechanisms. For example, in one embodiment, the extent of the gaps 107 can be controlled by the growth rate and/or growth time of the HSG growing stage. In other embodiments, the spacing of the HSG structures 104 may be adjusted by controlling other suitable operating parameters.

The individual HSG structures 104 may be aligned with respect to one another according to crystal orientation. For example, in one embodiment, the substrate material 102 includes a silicon wafer with the Si(1,1,1) crystal orientation (generally referred to as the c-plane) at the substrate surface 103. Without being bound by theory, it is believed that by forming the HSG structures 104 via epitaxial growth and/or annealing, the apexes 106 and the bases 109 of the HSG structures 104 can be aligned with the crystal orientation of the substrate surface 103 (i.e., at the c-plane). The hemispherical surfaces 108 are not at any preferential growth planes. In other embodiments, the substrate material 102 and the HSG structures 104 can also have other suitable crystal orientations.

FIGS. 3B-3E are cross-sectional views of the microelectronic substrate 100 during certain stages of a deposition operation of the process. During the deposition operation, a first semiconductor material 114 is formed on the substrate material 102 with the HSG structures 104. In one embodiment, the first semiconductor material 114 can include aluminum nitride (AlN), GaN, zinc nitride (ZnN), and/or other suitable buffer materials. In other embodiments, the first semiconductor material 114 can include N-type, P-type, or un-doped GaN, InGaN, gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum gallium nitride (AlGaN), aluminum gallium indium nitride (AlGaInN), and/or other suitable semiconductor materials.

Figure 3B:
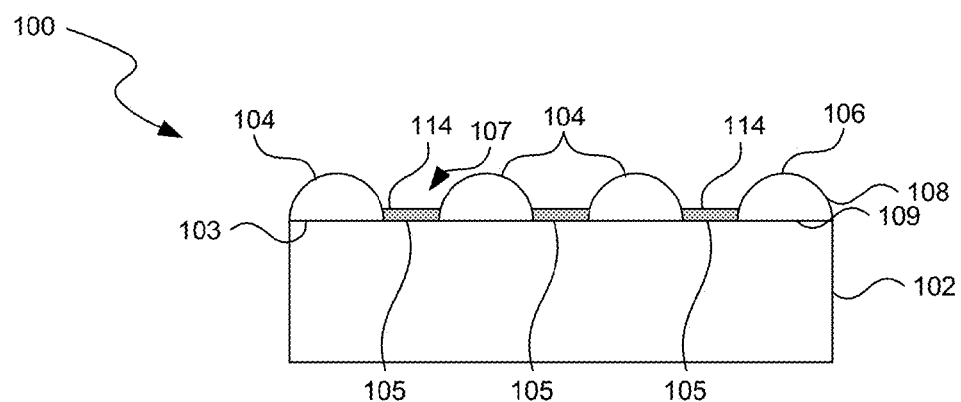

FIG. 3B shows an initial stage of the deposition process, in which the first semiconductor material 114 is deposited onto the substrate surface 103 of the substrate material 102. Suitable techniques for depositing the first semiconductor material 114 can include metal-organic CVD ("MOCVD"), molecular beam epitaxy ("MBE"), liquid phase epitaxy ("LPE"), hydride vapor phase epitaxy ("HVPE"), and/or other suitable epitaxial growth techniques. Without being bound by theory, it is believed that the first semiconductor material 114 can be preferentially formed on the exposed portions 105 of the substrate surface 103 in the gaps 107 along the c-plane and not on the hemispherical surfaces 108 of the HSG structures 104 because the hemispherical surfaces 108 do not have preferential growth planes. In certain embodiments, it is also believed that the first semiconductor material 114 may also form on the apexes 106 of the HSG structures 104, as described in more detail below with reference to FIGS. 4A-4C. In further embodiments, the first semiconductor material 114 may also form on other suitable crystal planes of the substrate surface 103 and/or the HSG structures 104.

Figure 3C:
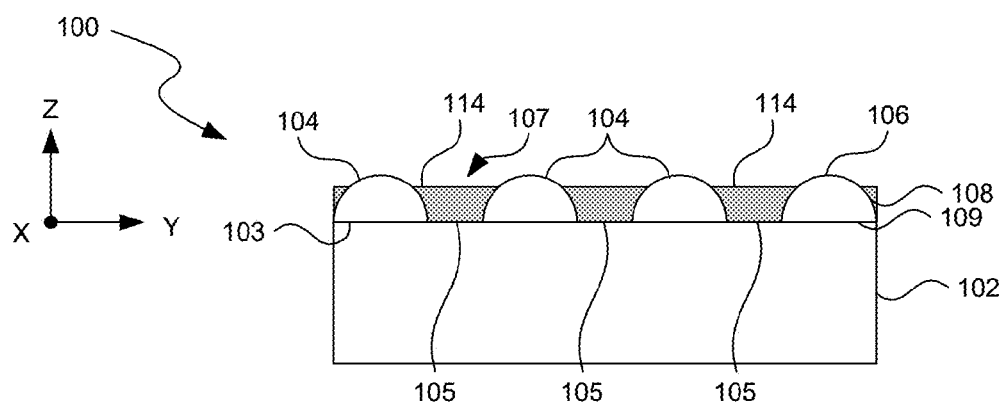

FIG. 3C shows another stage of the deposition process, in which the first semiconductor material 114 is grown laterally along the X- and/or Y-axis and vertically along the Z-axis in the gaps 107. In one embodiment, the first semiconductor material 114 may be grown along the X-, Y- and Z-axis simultaneously in the gaps 107. In another embodiment, the first semiconductor material 114 may be alternately grown laterally and vertically in sequence. For example, the first semiconductor material 114 may be grown along the X- and/or Y-axis until the first semiconductor material 114 is in direct contact with adjacent HSG structures 104. Subsequently, the first semiconductor material 114 may be grown along the Z-axis in the gaps 107 before repeating the lateral growth operation. In further embodiments, the first semiconductor material 114 may also be grown via other suitable growth sequences.

Various operating parameters may be adjusted to achieve the foregoing growth operations. For example, in embodiments utilizing MOCVD, at least one of a precursor concentration (e.g., a trimethylgallium concentration, a trimethylindium concentration, and/or other suitable precursor concentrations), a group III precursor molar ratio (e.g., a trimethylgallium-to-trimethylindium ratio), a group III to group V precursor molar ratio (e.g., a trimethylgallium-to-ammonia ratio), a precursor partial pressure (e.g., a trimethylindium partial pressure), a deposition pressure, a deposition temperature, and a deposition period may be adjusted based on a desired lateral/vertical growth ratio. In other embodiments, other suitable operating parameters may be adjusted based on the desired lateral/vertical growth ratio.

Figure 1:
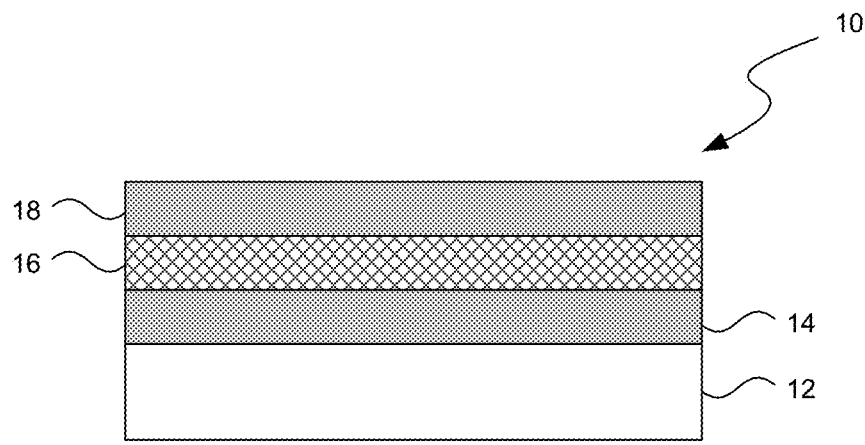
FIG. 1 is a cross-sectional view of a portion of an LED in accordance with the prior art.
Figure 2:
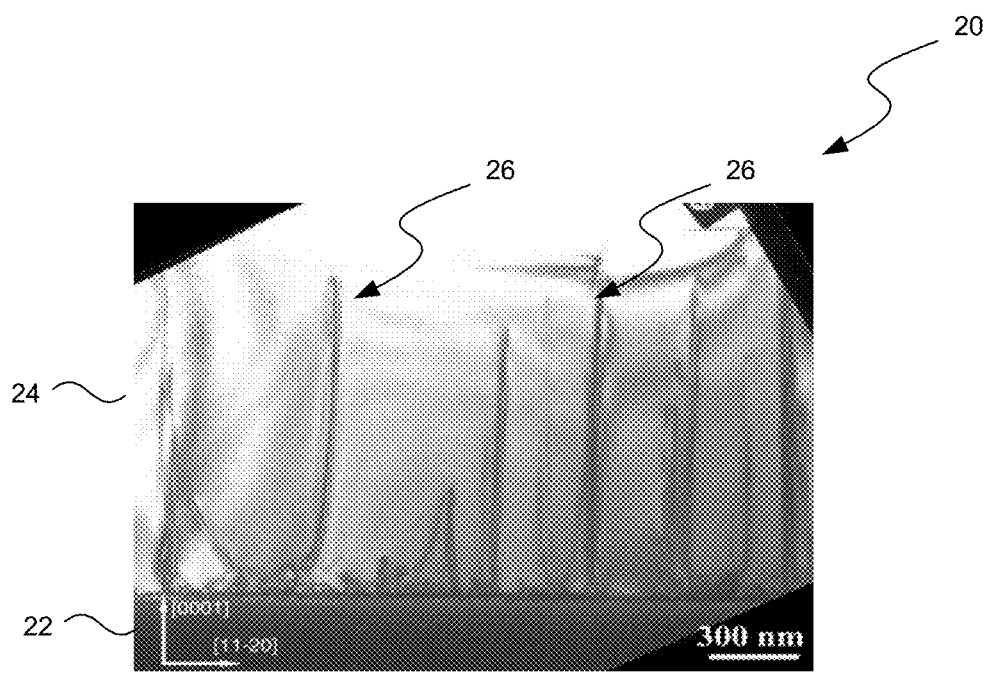
FIG. 2 is a TEM image of a portion of an LED in accordance with the prior art.

Without being bound by theory, it is believed that the lateral growth of the first semiconductor material 114 along the X- or Y-axis can at least reduce the number of dislocations in the first semiconductor material 114. It is believed that the X- and/or Y-axis lateral growth can disrupt or even prevent dislocations formed during the initial stage of the deposition operation from propagating further into the bulk of the first semiconductor material 114. As a result, the first semiconductor material 114 can have decreased dislocation densities when compared to the LED 10 in FIG. 1 or other conventional LEDs.

Figure 3D:
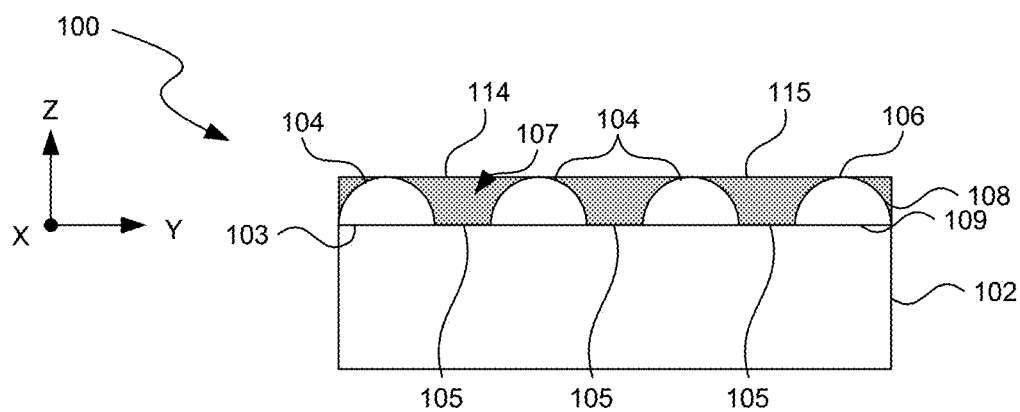
Figure 3E:
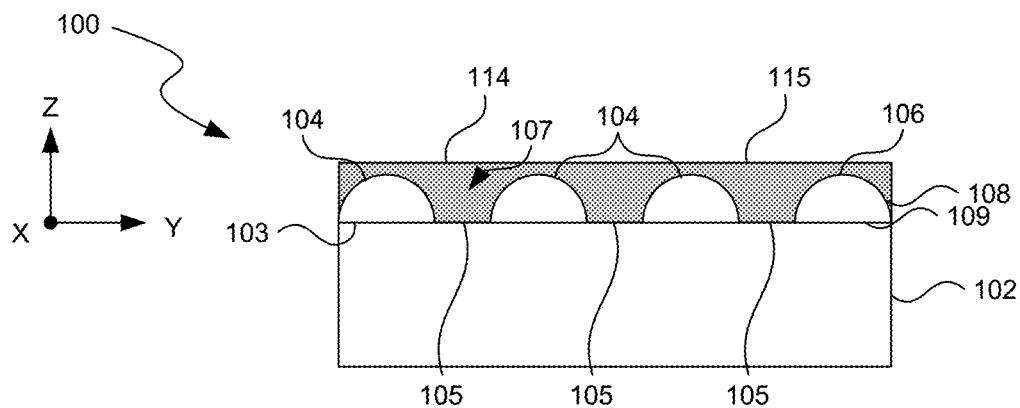

FIG. 3D shows another stage of the deposition process, in which the first semiconductor material 114 coalesces to substantially encapsulate the HSG structures 104. The coalesced first semiconductor material 114 can have a generally planar semiconductor surface 115 at a desired crystal plane. For example, the first semiconductor material 114 can include an N-type material, a P-type GaN material, or an InGaN material, and the semiconductor surface 115 can be at a crystal plane with a Miller index of (1,0,0,0), i.e., the c-plane. In other examples, the coalesced first semiconductor material 114 may also have a planar surface at other crystal planes or it may have a non-planar surface (not shown). FIG. 3E shows another stage of the deposition process, in which the first semiconductor material 114 is grown vertically along the Z-axis to a desired thickness (e.g., 40 nanometers) from the substrate surface 103.

Figure 3F:
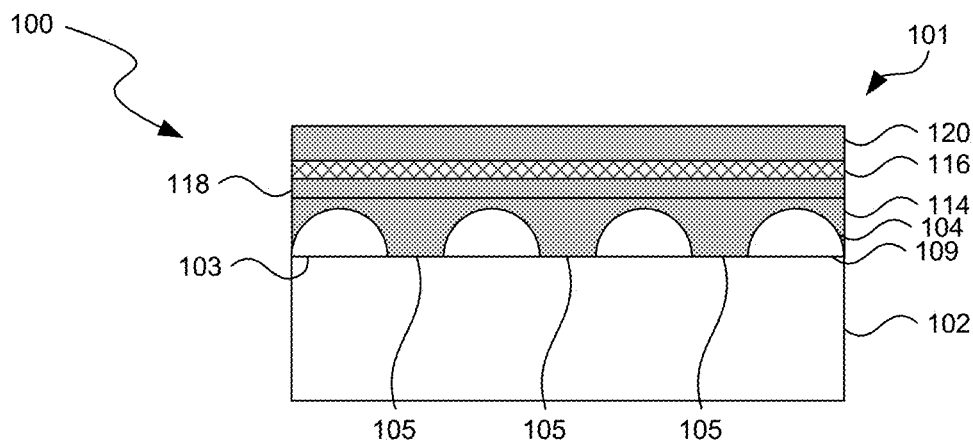

After the first semiconductor material 114 has been formed, FIG. 3F shows another operation of the process that can include forming an SSL structure 101 (e.g., an LED structure) on the first semiconductor material 114. In the illustrated embodiment, the SSL structure 101 includes a second semiconductor material 118, an active region 116, and a third semiconductor material 120 on the first semiconductor material 114. In certain embodiments, the second and third semiconductor materials 118 and 120 can include an N-type GaN material (e.g., doped with silicon (Si)) and a P-type GaN material (e.g., doped with magnesium (Mg)), respectively. In other embodiments, the second and third semiconductor materials 118 and 120 can also include AlGaN, AlGaAr, and/or other suitable semiconductor materials. In further embodiments, the first semiconductor material 114 can include an N-type or a P-type GaN material, and the second semiconductor material 118 may be omitted.

The active region 116 can include a single quantum well ("SQW"), multiple quantum wells ("MQWs"), and/or a bulk semiconductor material. As used hereinafter, a "bulk semiconductor material" generally refers to a single grain semiconductor material (e.g., InGaN) with a thickness greater than about 10 nanometers and up to about 500 nanometers. For example, in one embodiment, the active region 116 can include an InGaN SQW, InGaN/GaN MQWs, and/or an InGaN bulk material. In other embodiments, the active region 116 can include other suitable materials and/or configurations.

Even though the first semiconductor material 114 is described above as initially being formed on the exposed portions 105 of the substrate material 102, in certain embodiments, the first semiconductor material 114 may also be formed initially both on the apexes 106 of the HSG structures 104 and on the exposed portions 105 of the substrate material 102. In further embodiments, the first semiconductor material 114 may be formed initially on the apexes 106 of the HSG structures 104, as described in more detail below with reference to FIGS. 4A-4C.

Figure 4A:
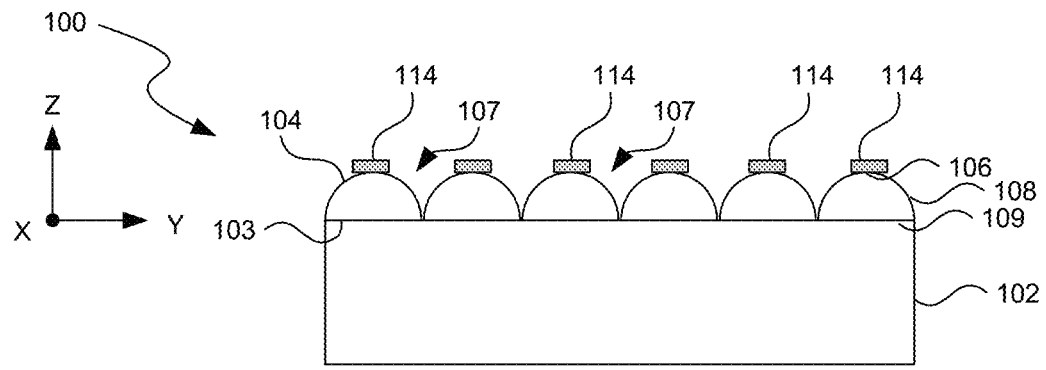
FIGS. 4A-4C are cross-sectional views of a portion of a microelectronic substrate undergoing a process for forming an SSL device in accordance with other embodiments of the technology.
Figure 4B:
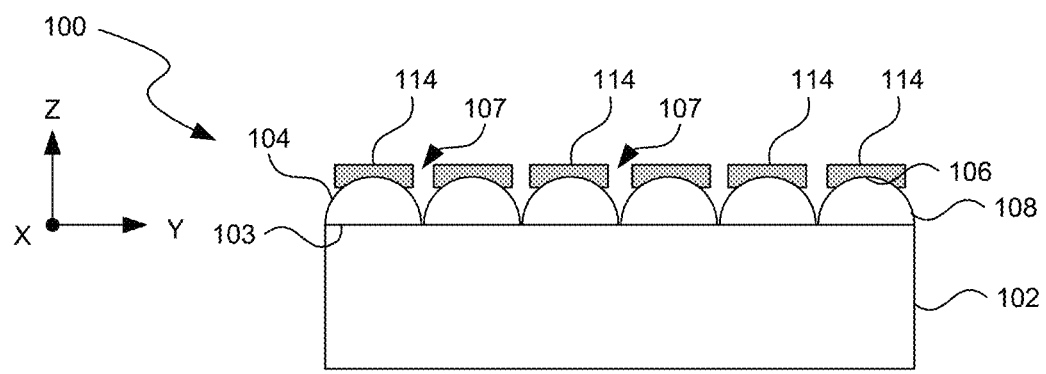
Figure 4C:
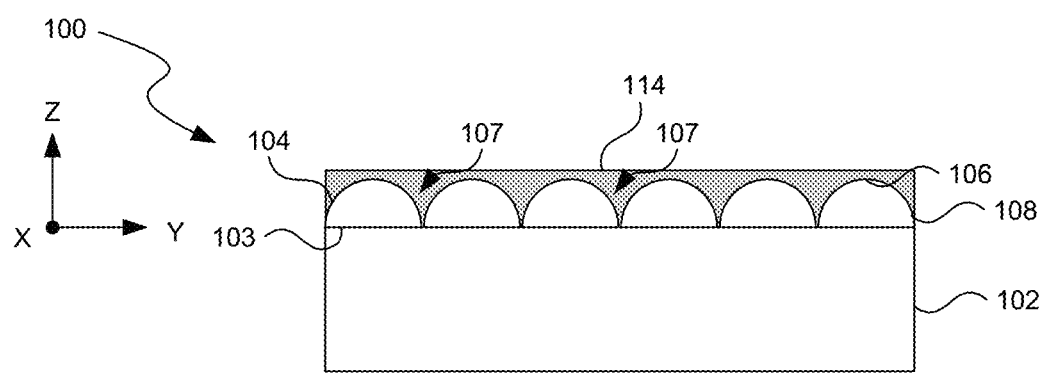

FIGS. 4A-4C are cross-sectional views of a portion of a microelectronic substrate 100 undergoing a process for forming an SSL device in accordance with other embodiments of the technology. As shown in FIG. 4A, the HSG structures 104 can be formed on the substrate surface 103 of a substrate material 102 with the bases 109 of adjacent HSG structures 104 in direct contact with one another. During an initial stage of the deposition process, it is believed that a first semiconductor material 114 can be preferentially formed on apexes 106 of the HSG structures 104 because the apexes 106 are at the c-plane while the hemispherical surfaces 108 do not have any preferential growth planes.

FIG. 4B shows another stage of the deposition process, in which the first semiconductor material 114 is grown in a combination of lateral and vertical directions into the gaps 107. FIG. 4C shows another stage of the deposition process, in which the first semiconductor material 114 coalesces to substantially encapsulate the HSG structures 104. Subsequently, the active region 116, the second semiconductor material 118, and/or other suitable components may be formed on the first semiconductor material 114, as described in more detail above with reference to FIG. 3E.

Even though the first semiconductor material 114 is grown via epitaxial growth in the processes discussed above, in certain embodiments, other suitable techniques may also be used. For example, in one embodiment, the first semiconductor material 114 may be formed via atomic layer deposition. During deposition, alternate layers of a first precursor (e.g., trimethylgallium) and a second precursor (e.g., ammonia) are alternately deposited onto the substrate material 102. The first and second precursors then react to form an amorphous layer composed of the first semiconductor material 114. The substrate material 102 with the first semiconductor material 114 can then be annealed to convert the amorphous first semiconductor material 114 into a single crystal structure.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A solid state lighting device, comprising:
a substrate;
a plurality of hemispherical grained silicon (HSG) structures positioned on the substrate;
a single-crystal semiconductor material positioned on the substrate and the plurality of HSG structures; and
an active region proximate the single-crystal semiconductor material, the active region including gallium nitride (Ga/N)/indium gallium nitride (InGaN) multiple quantum wells.

2. The solid state lighting device of claim 1 wherein the adjacent HSG structures are spaced apart from one another by a gap, and wherein a portion of the single-crystal semiconductor material generally completely fills the gaps.

3. The solid state lighting device of claim 1 wherein:
the adjacent HSG structures are spaced apart from one another by a gap; and
a portion of the substrate is in direct contact with the single-crystal semiconductor material through the individual gaps.

4. A solid state lighting device, comprising:
a substrate;
a plurality of hemispherical grained silicon (HSG) structures positioned on the substrate; and
a single-crystal semiconductor material positioned on the substrate and the plurality of HSG structures wherein;
the HSG structures individually include a base proximate the substrate, an apex spaced apart from the base, and a side surface between the base and the apex;
the adjacent side surfaces are spaced apart from one another by a gap;
the adjacent bases of the HSG structures are in direct contact with one another; and
a portion of the semiconductor material generally completely fills the gaps and is in direct contact with the side surfaces of the HSG structures.

5. The solid state lighting device of claim 1 wherein:
the HSG structures individually include a base proximate the substrate, an apex spaced apart from the base, and a side surface between the base and the apex;
adjacent side surfaces are spaced apart from one another by a gap; and
a portion of the substrate is exposed to the single-crystal semiconductor material by the individual gaps.

6. A solid state lighting device, comprising:
a substrate;
a plurality of hemispherical grained silicon (HSG) structures positioned on the substrate; and
a single-crystal semiconductor material positioned on the substrate and the plurality of HSG structures, wherein:

the HSG structures individually include a base proximate the substrate surface, an apex spaced apart from the base, and a side surface between the base and the apex;

at least one of the apex and base of the individual HSG structures is aligned in crystal orientation with that of the substrate; and adjacent side surfaces are spaced apart from one another by a gap.

7. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the semiconductor material has a pre-determined dislocation density;

an active region proximate the semiconductor material, the active region including gallium nitride (Ga/N)/indium (InGaN) multiple quantum wells.

8. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the semiconductor material has a pre-determined dislocation density, wherein:

the substrate includes at least a portion of a silicon wafer having a Si(1,1,1) crystal orientation;

the substrate includes a generally-planar surface;

the base and the apex of the individual HSG structures have a Si(1,1,1) crystal orientation;

the side surface of the individual HSG structures are not at any preferential growth planes;

the semiconductor material includes at least one of aluminum nitride (AlN), aluminum gallium nitride (AlGaN), and zinc nitride (ZnN);

the semiconductor material has a crystal orientation that generally corresponds to that of the substrate, the semiconductor material being generally parallel to the substrate;

the adjacent bases of the HSG structures are spaced apart from one another by a gap; and a portion of the substrate is exposed through the gap and in direct contact with semiconductor material.

9. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the Semiconductor material has a pre-determined dislocation density, wherein the HSG structures are generally aligned according to crystal orientation of the substrate and the side surface is hemispherical.

10. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the semiconductor material has a pre-determined dislocation density, wherein the base and the apex of the individual HSG structures have a Si(1,1,1) crystal orientation and the side surface hemispherical.

11. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the semiconductor material has a pre-determined dislocation density, wherein:

the base and the apex of the individual HSG structures have a crystal orientation generally corresponding to that of the substrate; and the side surface of the individual HSG structures are not at any preferential growth planes.

12. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the Semiconductor material has a pre-determined dislocation density, wherein:

the base and the apex of the individual HSG structures have a Si(1,1,1) crystal orientation;

the side surface of the individual HSG structures are not at any preferential growth planes; and the semiconductor material has a crystal orientation that generally corresponds to the crystal orientation of the substrate.

13. An apparatus for supporting a light emitting diode, comprising:

a substrate;

a plurality of hemispherical grained silicon (HSG) structures in direct contact with the substrate, the HSG structures having a base proximate the substrate, an apex spaced apart from the base, and a side surface between the base and the apex; and a semiconductor material on the substrate and substantially encapsulating the plurality of HSG structures, wherein the plurality of HSG structures are arranged such that the semiconductor material has a pre-determined dislocation density, wherein:

the base and the apex of the individual HSG structures have a Si(1,1,1) crystal orientation;

the side surface of the individual HSG structures are not at any preferential growth planes; and the semiconductor material includes at least one of aluminum nitride (AlN), aluminum gallium nitride (AlGaN), and zinc nitride (ZnN).

14. The apparatus of claim 7 wherein the plurality of HSG structures are spaced apart from one another.

15. A microelectronic device, comprising:

a substrate;

a plurality of hemispherical grained silicon (HSG) structures formed on the substrate, wherein the HSG structures individually include a base proximate the substrate surface, an apex spaced apart from the base, and a side surface between the base and the apex;

a single-crystal semiconductor material positioned on the substrate and the plurality of HSG structures, wherein the plurality of HSGs are arranged such that the semiconductor material has a pre-determined dislocation density; and an active region proximate the single-crystal semiconductor material, the active region including gallium nitride (Ga/N)/indium gallium nitride (InGaN) multiple quantum wells.

16. The microelectronic device of claim 15 wherein the adjacent HSG structures are spaced apart from one another by a gap, and wherein a portion of the single-crystal semiconductor material generally completely fills the gaps.

17. The microelectronic device of claim 15 wherein:

the adjacent HSG structures are spaced apart from one another by a gap; and a portion of the substrate is in direct contact with the single-crystal semiconductor material through the individual gaps.

18. The microelectronic device of claim 15 wherein:

the adjacent side surfaces are spaced apart from one another by a gap;

the adjacent bases of the HSG structures are in direct contact with one another; and a portion of the single-crystal semiconductor material generally completely fills the gaps and is in direct contact with the side surfaces of the HSG structures.

19. The microelectronic device of claim 15 wherein:

the adjacent side surfaces are spaced apart from one another by a gap; and a portion of the substrate is exposed to the single-crystal semiconductor material by the individual gaps.

20. A microelectronic device, comprising:

a substrate;

a plurality of hemispherical grained silicon (HSG) structures formed on the substrate, wherein the HSG structures individually include a base proximate the substrate surface, an apex spaced apart from the base, and a side surface between the base and the apex; and a single-crystal semiconductor material positioned on the substrate and the plurality of HSG structures, wherein the plurality of HSGs area arranged such that the semiconductor material ha a pre-determined dislocation density, wherein:

at least one of the apex and base of the individual HSG structures is aligned in crystal orientation with that of the substrate; and the adjacent side surfaces are spaced apart from one another by a gap.

* * * * *

UNITED STATES PATENT AND TRADEMARK OFFICE
CERTIFICATE OF CORRECTION

| | |
|---|---|
| PATENT NO. | : 9,246,051 B2 |
| APPLICATION NO. | : 14/276163 |
| DATED | : January 26, 2016 |
| INVENTOR(S) | : Cem Basceri and Thomas Gehrke |

It is certified that error appears in the above-identified patent and that said Letters Patent is hereby corrected as shown below:

Claims

In column 7, line 67, in claim 9, delete "Semiconductor" and insert -- semiconductor --, therefor.

In column 8, line 49, in claim 12, delete "Semiconductor" and insert -- semiconductor --, therefor.

In column 10, line 26, in claim 20, delete "HSGs area" and insert -- HSGs are --, therefor.

In column 10, line 27, in claim 20, delete "material ha" and insert -- material has --, therefor.

Signed and Sealed this
Twenty-sixth Day of April, 2016

Michelle K. Lee
*Director of the United States Patent and Trademark Office*